(12) United States Patent
Clevenger et al.

(10) Patent No.: US 8,828,521 B2
(45) Date of Patent: *Sep. 9, 2014

(54) CORRUGATED INTERFACES FOR MULTILAYERED INTERCONNECTS

(71) Applicant: International Business Machines Corporation, Armonk, NY (US)

(72) Inventors: Lawrence A. Clevenger, LaGrangeville, NY (US); Timothy J. Dalton, Ridgefield, CT (US); Elbert E. Huang, Carmel, NY (US); Sampath Purushothaman, Yorktown Heights, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/912,593

(22) Filed: Jun. 7, 2013

(65) Prior Publication Data

US 2013/0273325 A1    Oct. 17, 2013

Related U.S. Application Data

(62) Division of application No. 11/836,253, filed on Aug. 9, 2007, now Pat. No. 8,512,849.

(51) Int. Cl.
*B32B 3/30* (2006.01)
*H05K 3/40* (2006.01)
*H01L 21/033* (2006.01)
*H01B 17/66* (2006.01)
*H01L 21/311* (2006.01)
*H01L 23/532* (2006.01)

(52) U.S. Cl.
CPC .............. *H05K 3/40* (2013.01); *H01L 21/0337* (2013.01); *H01B 17/66* (2013.01); *H01L 218/76822* (2013.01); *H01L 21/31144* (2013.01); *H01L 23/53295* (2013.01)
USPC ............ 428/161; 426/162; 426/163; 426/172

(58) Field of Classification Search
USPC .................. 428/161, 162, 163, 172, 182, 701
See application file for complete search history.

(56) References Cited

U.S. PATENT DOCUMENTS 6,214,479 B1    4/2001  Mori et al.
7,025,826 B2    4/2006  Selvamanickam et al.
(Continued)

FOREIGN PATENT DOCUMENTS

| CN | 166130 A | 9/2005 |
| EP | 1316402 A1 | 6/2003 |
| JP | 3232117 A | 10/1991 |
| JP | 20055270993 A | 10/2005 |
| WO | 2006036196 A2 | 4/2006 |

OTHER PUBLICATIONS

Abstract of Japanese Publication No. JP2002020892 published on Jan. 23, 2002; 2 pages.

(Continued)

*Primary Examiner* — Donald J Loney
(74) *Attorney, Agent, or Firm* — Cantor Colburn LLP; Catherine Ivers

(57) ABSTRACT

Dielectric composite structures comprising interfaces possessing nanometer scale corrugated interfaces in interconnect stack provide enhances adhesion strength and interfacial fracture toughness. Composite structures further comprising corrugated adhesion promoter layers to further increase intrinsic interfacial adhesion are also described. Methods to form the nanometer scale corrugated interfaces for enabling these structures using self assembling polymer systems and pattern transfer process are also described.

6 Claims, 4 Drawing Sheets

(56) References Cited

U.S. PATENT DOCUMENTS

| | | |
|---|---|---|
| 8,512,849 B2 * | 8/2013 | Clevenger et al. ............ 428/161 |
| 2004/0043146 A1 * | 3/2004 | Pellerite et al. ............ 427/207.1 |
| 2004/0115826 A1 | 6/2004 | Budach et al. |
| 2004/0178523 A1 * | 9/2004 | Kim et al. .................... 264/1.27 |
| 2005/0167261 A1 | 8/2005 | Deutchman et al. |
| 2005/0173803 A1 | 8/2005 | Lu et al. |
| 2005/0205863 A1 * | 9/2005 | Choi et al. ...................... 257/40 |
| 2005/0221072 A1 | 10/2005 | Dubrow et al. |
| 2005/0247671 A1 | 11/2005 | Yaniv et al. |
| 2005/0277266 A1 | 12/2005 | Cooney, III et al. |
| 2009/0041989 A1 | 2/2009 | Clevenger et al. |

OTHER PUBLICATIONS

Abstract of Japanese Publication No. JP2006500769 A, published on Jan. 5, 2006; 2 pages.

Abstract of Japanese Publication No. JP2006515153 A, published on May 18, 2006; 2 pages.

Abstract of Japanese Publication No. JPH0878521 A, published on Mar. 22, 1996; 2 pages.

Zimmer, K., "Precise etching of fused silica for micro-optical application", Applied Surface Science, vol. 243, Nos. 1-4, Apr. 30, 2005, ISSN 0169-4332, cover, pp. 415-420.

* cited by examiner

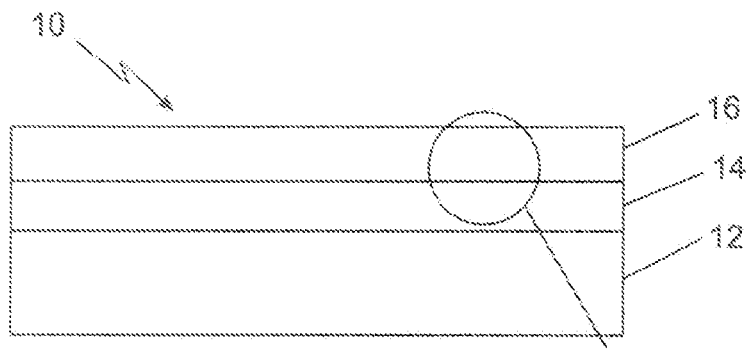
FIG. 1
PRIOR ART
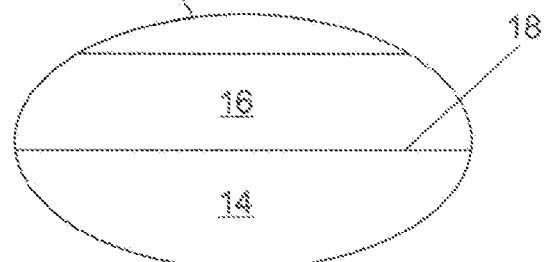
FIG. 6
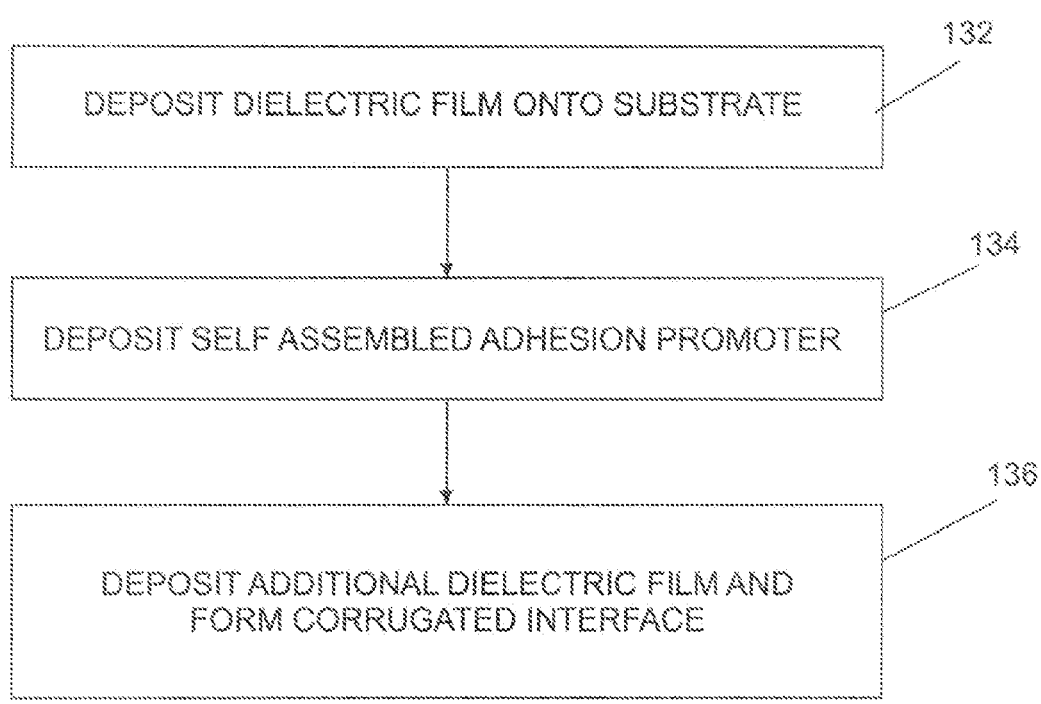

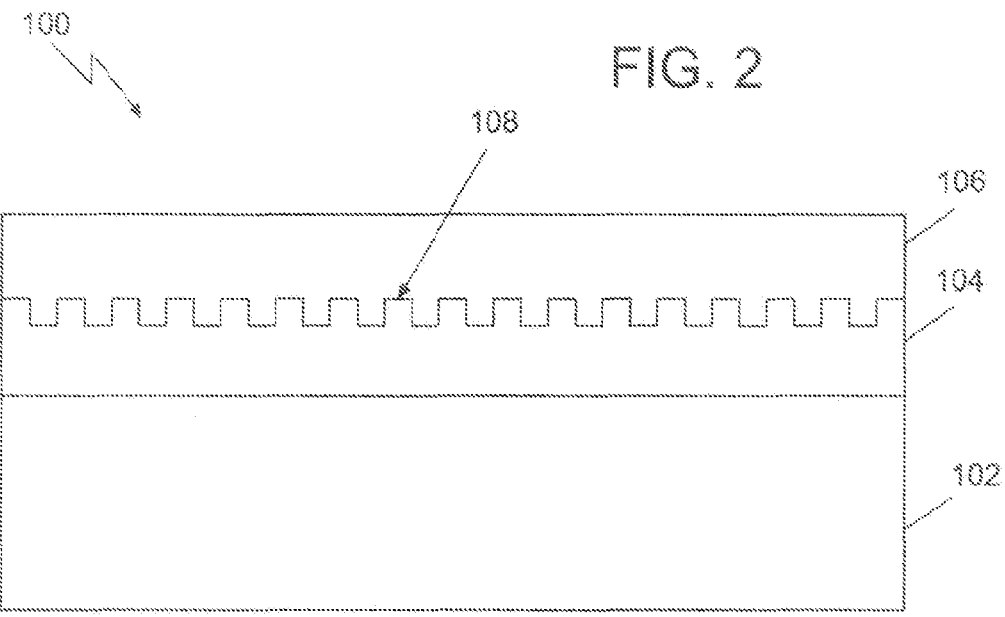
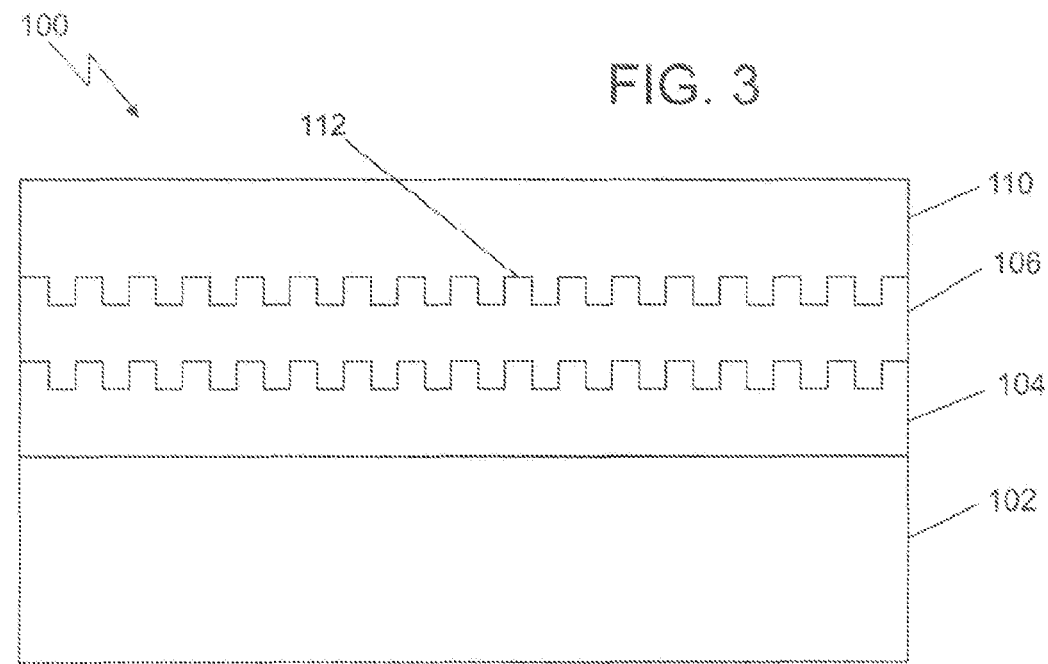

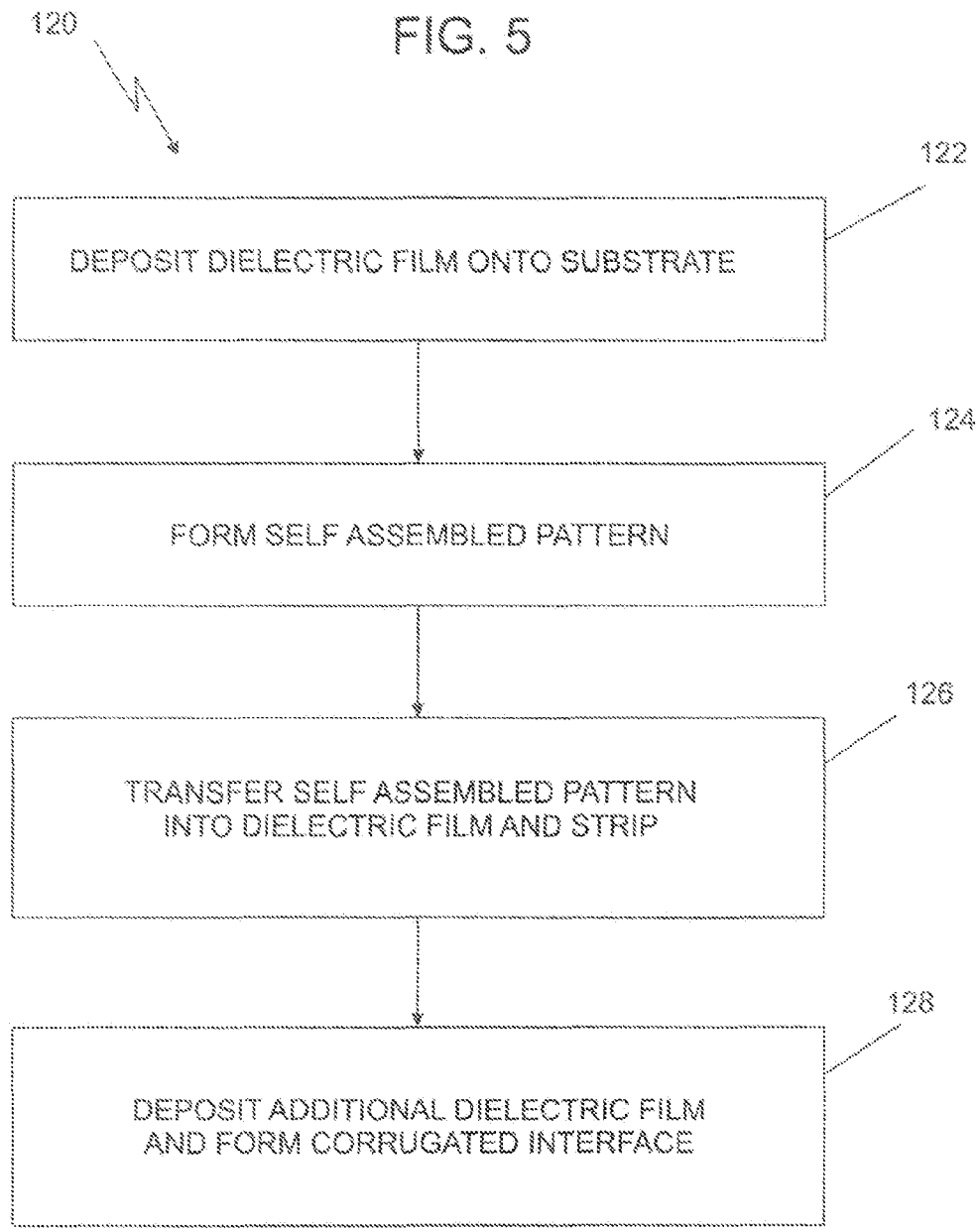

CORRUGATED INTERFACES FOR MULTILAYERED INTERCONNECTS

CROSS-REFERENCE TO RELATED APPLICATION

This application is a DIVISIONAL application of U.S. patent application Ser. No. 11/836,253, filed Aug. 9, 2007, the disclosure of which is also incorporated herein by reference in its entirety.

FIELD OF THE INVENTION

This invention relates to interconnect structures and more particularly to multi-layered interconnect structures wherein an interface between the layers includes a corrugated structure. The corrugated structure provides improved adhesion and fracture toughness, among others.

DESCRIPTION OF BACKGROUND

Advanced microelectronic interconnects can include multiple stacked layers of dielectric films. Due to the large number of interfaces between dielectric layers, interfacial adhesion is critical to ensure a reliable and robust structure that can survive the various fabrication processes and conditions used to fabricate the desired device. With the advent of mechanically fragile low k and ultra low k dielectric currently being used or explored in these advanced applications, the issues of maintaining adequate interfacial adhesion as well as overall fracture toughness of the multilayer stack is becoming more important.

FIG. 1 provides a prior art device structure generally designated by reference numeral 10 that includes multiple stacked dielectric layers. The device structure is exemplary and is provided to illustrate an interface between the dielectric layers, which are of the type commonly formed during the fabrication of advanced microelectronic devices. The structure 10 generally includes a substrate 12, a first dielectric film 14 disposed on the substrate, and at least one additional dielectric layer 16 disposed on the first dielectric layer. As shown, an interface 18 formed between the first and second dielectric film is substantially smooth, which can result in mechanical failure during fabrication of the device in which additional layers are added and patterns are formed thereon. For example, adhesion failure and fracturing of one or more the layers can occur.

Tailoring of the interfaces by appropriate chemical and/or plasma treatment to provide improved wetting of the layers is known in the art. For example, U.S. Pat. No. 6,214,479 to Mori et al., U.S. Pat. No. 7,025,826 to Selvamanickam et al., and US Pub. Appln. No. 2005/0167261A1 to Deusthmann et al. describe methods employing an inert or reactive gas ion exposure and bombardment of a substantially smooth interface surface to provide physical surface topography such that an additional layer disposed thereon will have a complementary topography, thereby providing improved adhesion and fracture toughness. However, the topography provided by these treatments is generally random. Moreover, the morphology in the lateral and vertical directions is difficult to control and reproduce. Still further, these processes are generally substrate dependent.

The various known surface treatments such as those noted above can also lead to undesirable chemical modification of the substrate depending on the plasma gases employed. For example, it is generally difficult with these processes to localize the chemical modification caused by plasma exposure of the substrate to the top surface (the interface) only. In the case of low k dielectric films of interest for chip applications, the interconnect electrical characteristics (e.g., dielectric constant (k) and breakdown fields) can be significantly and undesirably degraded as a result of the plasma exposures. A good example of this has been observed with the use of mild oxidizing plasma treatments to provide improved adhesion on porous organosilicate dielectric films. Although the plasma treatment renders the organosilicate surface more hydrophilic and wettable, significant damage occurs throughout the depth of the organosilicate low k dilectric making this type of process unsuitable. Damage manifests itself in the form of a higher dielectric constant (higher k) and lowers the breakdown strength of the dielectric. Thus, the use of the above noted chemical means to enhance adhesion and fracture toughness in these structures is limited in practicality.

Rough textures have also been achieved in polymer sheets using mechanical profiling tools such as knurled rollers. However, the use of mechanical profiling tools is generally impractical for use with interconnecting structures with thin dielectric layers because of the fragility of the microelectronic components and substrates, many or which are processed on fragile silicon wafers and comprise thin dielectric and metal films.

It is also known that mechanical interlocking between layers can be used to enhance adhesion in macroscopic structures such as fiber and laminar composite systems. However, in comparison with a carbon fiber in a fiber/epoxy composite which may be a few to ten microns in diameter, a typical layer of ultra low k dielectric interconnect stack may be only 100 to 200 nanometers (nm) in thickness. Thus, the scale of surface corrugation one has to achieve in these films has to be on the order of several nanometers in depth. Further, since the metal feature sizes embedded in these structures are on the order of 50 to 100 nm in lateral extent, the wavelength of these corrugations in plane has to be on this order as well. A high corrugation density (i.e., short wavelength) is also desirable to maximize the total contacted interface area for a given projected interface area between the layers.

Thus, it is clear that suitable methods to achieve well controlled, non-damaging, reproducible, nanoscale corrugations in substrates and thin film coatings of interest in microelectronics is desirable and is not readily achieved by methods known in the current state of art. Such a surface topography will greatly enhance the effective contact surface area between a substrate or an underlying film and an overlying film. The force needed to separate the overlayer film to the underlayer film will correspondingly be increased in proportion to the contact surface area for a given interfacial adhesion strength per unit area. Further, an additional benefit will be realized due to the fact that any propagating interface crack will be blocked and perhaps deflected by the nanoscale corrugations leading to a tortuous crack front that normally leads to increased fracture toughness.

Accordingly, there remains a need in the art for methods that provide surface topography to interface regions of interconnect stacks in a controlled and reproducible manner so as to provide increased adhesion and fracture toughness. Desirably, the methods should provide minimal impact on properties of the other components.

SUMMARY OF THE INVENTION

The shortcomings of the prior art are overcome and additional advantages are provided through the provision of processes and device structures having nanoscale corrugated interfaces between dielectric layers within an interconnect stack. The processes for providing the nanoscale corrugations are well controlled and reproducible, i.e., not random.

In one embodiment, the device structure comprises a first dielectric layer having a corrugated top surface, wherein the corrugated surface comprises a plurality of troughs and ridges having a substantially constant pitch; and a second dielectric layer disposed on the first layer having a complementary corrugated surface.

In another embodiment, the device structure comprises a first dielectric layer having a planar top surface; an adhesion promoter layer disposed in the first dielectric layer having a corrugated pattern comprising a plurality of troughs and ridges at a substantially constant pitch; and a second dielectric layer disposed on the adhesion promoter layer having a complementary corrugated surface to the adhesion promoter.

A process for forming a device structure comprises forming a first dielectric film layer; forming a self assembled film pattern onto the first dielectric film layer; transferring the self assembled film pattern into the first dielectric film layer; and depositing a second dielectric film layer onto the first dielectric film and forming a corrugated interface.

In another embodiment, the process for forming a device structure comprises forming a first dielectric film layer having a planar surface; forming a self assembled adhesion promoter pattern on the planar surface of the first dielectric film layer pattern, wherein the self assembled adhesion promoter pattern has a corrugated spacing of less than 100 nanometers; and depositing a second dielectric film layer onto the self assembled adhesion promoter pattern to provide a corrugated interface therebetween.

In still another embodiment, the process for forming a device structure comprises forming a first dielectric film layer; forming a self assembled film pattern onto the first dielectric film layer; transferring the self assembled film pattern into the first dielectric film layer to form corrugations in the first dielectric film layer at a spacing less than 100 nanometers; depositing a conformal layer of an adhesion promoter onto the first dielectric layer; and depositing a second dielectric film layer onto the first dielectric film and forming a corrugated interface therebetween.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

Disclosed herein are device structures containing one or more interconnect stacks formed of dielectric layers having engineered nanoscale corrugations at selected interfaces and self-assembly mediated methods to fabricate the same. The term "nanoscale corrugations" is hereinafter defined as a plurality of defined ridges and troughs having a substantially constant pitch. The defined ridges and troughs each have widths on the order of about 100 nanometers and less in one embodiment, less than about 50 nanometers in other embodiments and from about 10 to about 50 nm in still other embodiments. For practical applications, it is additionally desirable to limit the depth of the corrugations to no more than 20% but preferably to about 10% of the thickness of the individual dielectric layers in the structure. The particular heights/depth will generally depend on the particular application and device design. The nanoscale corrugations advantageously enable increased interlayer adhesion through the formation of high specific area interlocked interfaces, and enhanced cracking/fracture resistance due to the increased crack front tortuousity. Additional interface area per unit projected area by a factor of 2 h/p can be enabled by means of corrugations with a nominal depth of h units and a pitch of p units. Thus for a given corrugation depth, which is usually dictated by film thickness, the interface area can be significantly enhanced if the pitch can be made smaller. As will be described in greater detail below, the process for forming the nanoscale corrugations is well defined and controlled.

In one embodiment, the process for forming the device structure with the corrugated film employs phase separated polymer self assembly. The self-assembled films can be prepared from polymers selected to form alternating polymer phases, e.g., alternating hydrophilic and hydrophobic regions. Once formed, one of the components is then selectively removed with an appropriate solvent, reactive ion etch process, exposure to ultraviolet or electron beam radiation or the like and combinations thereof.

As a result of the summarized invention, technically we have achieved a solution and device structure which can improve adhesion and fracture resistance at interfaces between interlayers of multilayered interconnect film stacks.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates a cross sectional view of an interface of a prior art multilayered interconnect structure;

FIG. 2 illustrates one example of nanoscale corrugated structure formed at an interlayer between two dielectric layers;

FIG. 3 illustrates one example of multiple nanoscale corrugated structures formed at interfaces defined by the multiple stacked dielectric layers;

FIG. 5 illustrates a process flow for forming the nanoscale corrugated structure in accordance with one embodiment;

FIG. 6 illustrates a process flow for forming the nanoscale corrugated structure in accordance with another embodiment.

Figure 4:
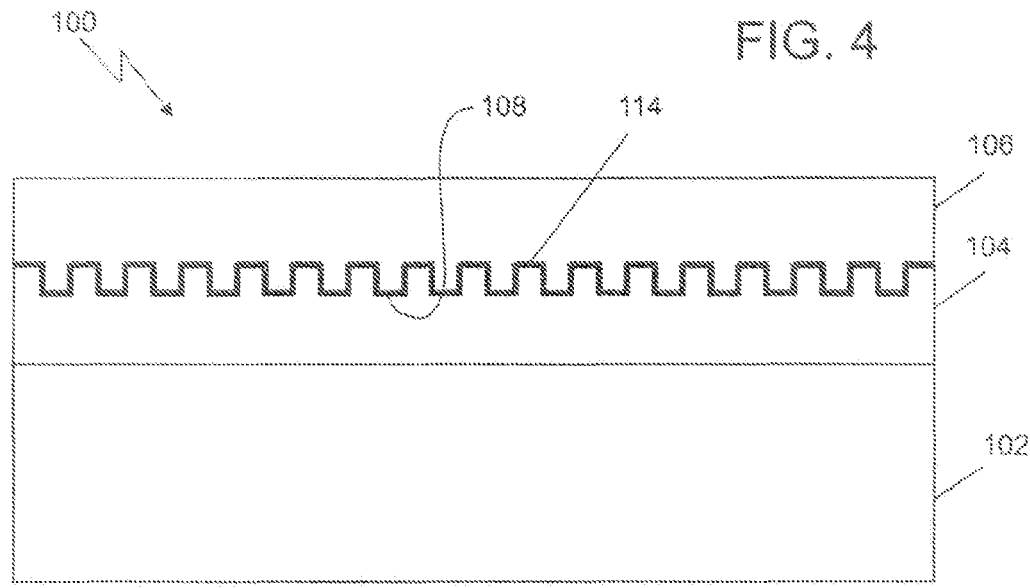
FIG. 4 illustrates one example of nanoscale corrugated structure formed using a self assembled adhesion promoter.

The detailed description explains the preferred embodiments of the invention, together with advantages and features, by way of example with reference to the drawings.

DETAILED DESCRIPTION OF THE INVENTION

Self assembled films that laterally phase separate into regions with distinct compositions throughout the film are ideally suited as corrugation templates as the length scale in which the phase separation occurs can be in the range of approximately 5 to 100 nm. There are numerous examples of self assembled films that may be utilized for these purposes and they include a polymer mixture, a block copolymer, a mixture of homopolymer and block copolymer, a mixture of different block copolymers, a mixture of homopolymer and nanoparticles, a mixture of block copolymer and nanoparticles, sol-gel system containing surfactants, or any combination thereof. The invention is not intended to be limited to any particular type of self assembled film. By way of example, the polymers can contain block structures that contain spatially separated hydrophilic and hydrophobic blocks, i.e., amphiphilic polymers.

Referring now to FIG. 2, there is shown device 100 that includes controlled, nanometer scale corrugations at the interfaces (drawing not to scale) between dielectric layers. Device 100 includes a substrate 102, a first dielectric layer 104 disposed on the substrate 102, and a second layer 106 disposed on the first dielectric layer 104. It should be noted that the first and second dielectric layers 104, 106, respectively, are not intended to be limited to deposition directly onto the substrate 102 as shown and can be formed anywhere during fabrication of the device where multiple stacked dielectric layers are desired. An interface 108 formed between the first and second dielectric layers 104, 106 include nanoscale corrugations. As will be described in greater detail below, the nanoscale corrugations are first formed on the top surface of the first dielectric layer 104 onto which the second dielectric layer is disposed. The corrugated interface 108 is periodic having a defined pitch and designed to have vertical and lateral dimensions in the range of 2 to 200 nm and more preferably in the range of 2 to 20 nm. The interface between the substrate 102 and the first dielectric 104 can also be corrugated in the same manner. That is either or both of the interfaces present in FIG. 2 can be corrugated. It is desirable that the corrugation height is on the order of or less than 20% of the thickness of the dielectric layers used. In other embodiments the corrugation height is less than 10% of the dielectric layers used.

As described earlier, the presence of the nanoscale corrugations will provide enhanced interfacial adhesion strength and fracture toughness in the inventive structures as compared to the prior art structure with smooth interfaces or those structures having irregular topography that is not reproducible.

Optionally, as shown in FIG. 3, the device 100 can include additional dielectric layers 110. The interface 112 formed between the second dielectric layer 106 and the additional layer 110 can be nanoscale corrugated. The structure includes the substrate 102 on which the first dielectric film 104 is disposed. In principle, the amount of additional dielectric layers and corrugated interfaces therebetween are not intended to be limited.

Such a structure will have increased interfacial adhesion strength and fracture toughness as compared to prior art multilayer structures with smooth interfaces.

In FIG. 4, the device 100 may include an optional adhesion promoter 114 disposed at an interface between dielectric layers e.g., the first and second dielectric layers 104, 106 as shown. The optional adhesion promoter 114 can be disposed onto the top corrugated surface of the underlying dielectric layer (e.g., layer 104) or may be used to form the corrugations as will be discussed in greater detail below. For example, a block copolymer that contains the adhesion promoter as one of the blocks can be suitably used to form such a structure. The polymer is coated onto the smooth surface of the dielectric layer 104 and then nanocorrugated by using phase separated self-assembly and subsequent development processing. Possible candidates for this adhesive promoter component may include organic or inorganic materials. Specific examples of inorganic adhesion promoter components may be selected from the group consisting of $Si_xL_yR_z$, where L is selected from the group consisting of hydroxy, methoxy, ethoxy, acetoxy, alkoxy, carboxy, amines, halogens, and R is selected from the group consisting of hydrido, methyl, ethyl, vinyl, and phenyl (any alkyl or aryl), wherein y may be equal to 1 and y+z=4 Some examples of adhesion promoters with such components include: vinyltriacetoxysilane, aminopropyltrimethoxysilane, vinyl trimethoxysilane, commercial materials such as HOSP (Honeywell). Examples of organic adhesion promoters may include FF-02 or AD-00 (from Japanese Synthetic Rubber, JSR). Suitable formulations incorporating these functionalities with another polymer phase can be used to enable phase separated nanocorrugated adhesion promoter regions.

In addition to the strengthening effects from nanoscale corrugations, the use of the optional adhesion promoter derives a further enhancement in adhesion strength due to the improved interfacial chemical bonding as provided by the tailored chemical make up of the adhesion promoter. Furthermore, since the use of corrugated adhesion promoters does not require an additional process to transfer the pattern of the phase separated self assembled film, additional processing and cost benefits may be realized.

By extension, a multilayer dielectric stack similar to the one in FIG. 3 except with corrugated adhesion promoter layers at the interfaces between the dielectric layers can also be fabricated.

FIG. 5 illustrates a process flow 120 for forming the nanoscale corrugate interfaces between dielectric layers in accordance with one embodiment. The first step 122 of the process flow includes depositing a dielectric layer onto a substrate or alternatively, a layer of material utilized during fabrication of the device. The substrate can be a silicon wafer or other similar semiconductor substrate wafer with or without additional patterns, transistor devices, interconnect wiring; multilayer ceramic chip carrier substrate, printed wiring board and the like. The dielectric film can be applied by one of the many known methods in the art such as chemical vapor deposition (CVD), plasma enhanced chemical vapor deposition (PECVD), spin coating, curing and the like. The dielectric film can be formed of organic polymers, inorganic films or organosilicate dielectrics such as SiCOH comprising silicon, carbon, oxygen and hydrogen. It can be nonporous or contain controlled levels of porosity introduced by tailored processing methods generally known to those of ordinary skill in the art.

In step 124, a self assembling mask layer is formed on top of the dielectric layer. Self assembled films that laterally phase separate into regions with distinct compositions throughout the film are ideally suited as corrugation templates as the length scale in which the phase separation occurs can be in the range of about 2 to about 100 nm. There are numerous examples of self assembled films that may be utilized for these purposes and they include: a polymer mixture, a block copolymer, a mixture of homopolymer and block copolymer, a mixture of different block copolymers, a mixture of homopolymer and nanoparticles, a mixture of block copolymer and nanoparticles, sol-gel system containing surfactants, or any combination thereof.

Optionally, a pretreatment or a pre-coating of the surface of the dielectric film may be performed to promote the appropriate morphology and/or orientation of the self assembled film. For example, it may be desirable to increase the wettability of the dielectric surface. The self assembling film can be deposited on top by a solvent mediated process (e.g., spin coating). This film is optionally annealed at temperatures ranging from 75-350° C. but preferably in the range of 100 to 200° C. to promote lateral phase separation. This leads to a two phase structure preferably comprising domains made of alternating stripes of the two components in the original system. One of the components of the self assembled film is then stripped or removed by a selective process which may include a solvent develop, a reactive ion etch process, and the like. This results in a film having a topography that can be used as the corrugation template. As an example, a block copolymer of polymethylmethacrylate (PMMA) and polystyrene (PS) can be used to form a phase separated stripe structure with alternating PMMA and PS regions by a post deposition anneal process at 180° C. The width of the stripes can be tailored by appropriately selecting the molecular weight of the PMMA and PS segments in the original copolymer. Widths in the 10 to 50 nm are achievable with this system. When the phase separated structure is immersed in a solution of acetic acid, the PMMA regions are preferentially dissolved away leaving a pattern that forms the self assembled mask. The pattern of the self assembled film can then be transferred into the underlying dielectric by a subsequent transfer process (e.g., reactive ion etch, wet etch, etc.) to create the intended corrugations with the desired depth. Any remnants of the self assembled film (i.e., the mask) are dissolved or stripped to form ridges and troughs in the dielectric film.

Other self-assembling systems can be used to tailor the size scale of the pattern in a wider range from 2 to 200 nm and a preferred range of 2 to 20 nm is achievable.

In step 128, an additional dielectric film is applied on top of the underlying dielectric film, thereby forming a corrugated interface between the dielectric layers. Each dielectric film can be same or different and can be applied by the same or different deposition methods depending on the type of material being deposited. The resulting device structure is shown in FIG. 2.

In another embodiment, the process flow 130 shown in FIG. 6 includes a first step 132 of depositing the dielectric film in the manner previously described. In the next step 134, a self assembled adhesion promoter is deposited onto the dielectric film. This can be accomplished by a self assembly process very similar to the one described in relation to FIG. 2 except by using a copolymer or blend system wherein the remnant component can form the adhesion promoter layer. For example, the self assembled adhesion promoter can be tailored to have pendant functional groups such as amino, hydroxyl, carboxylic, hydrido, carbonyl and alkoxy groups which will promote adhesion to the additional dielectric film when it is coated over the self assembled adhesion promoter layer as in step 136. Suitable candidates for this adhesive component may include organic or inorganic materials. The adhesive component may be comprised of small molecular weight molecules, oligomeric, or polymeric molecules. Specific examples of inorganic adhesion promoter functionalities may be selected from the group consisting of $Si_xL_yR_z$, where L is selected from the group consisting of hydroxy, methoxy, ethoxy, acetoxy, alkoxy, carboxy, amines, halogens, and R is selected from the group consisting of hydrido, methyl, ethyl, vinyl, and phenyl (any alkyl or aryl) where y may be equal to 1 and $y+z=4$. Some examples of such adhesion promoters containing such functionalities which may be used in blend systems include: vinyltriacetoxysilane, aminopropyltrimethoxysilane, vinyl trimethoxysilane, HOSP (Honeywell). Examples of organic adhesion promoters may include FF-02 or AD-00 from Japanese Synthetic Rubber, JSR). The resulting structure after the additional dielectric is applied is shown in FIG. 4 wherein the corrugations of the adhesion promoter layer are now filled resulting in the final structure. In such a case, the phase separated self assembled material will have at least one component that serves as an adhesion layer and another component that may be removable. This removal process may be selective and may include a solvent develop or reactive ion etch that results in the retention of the component serving as the adhesion layer having a corrugation that is defined by the self assembly process. The component that serves as an adhesion layer will have good adhesive properties to the underlying substrate and the layer deposited atop this adhesion layer.

Figure 7:
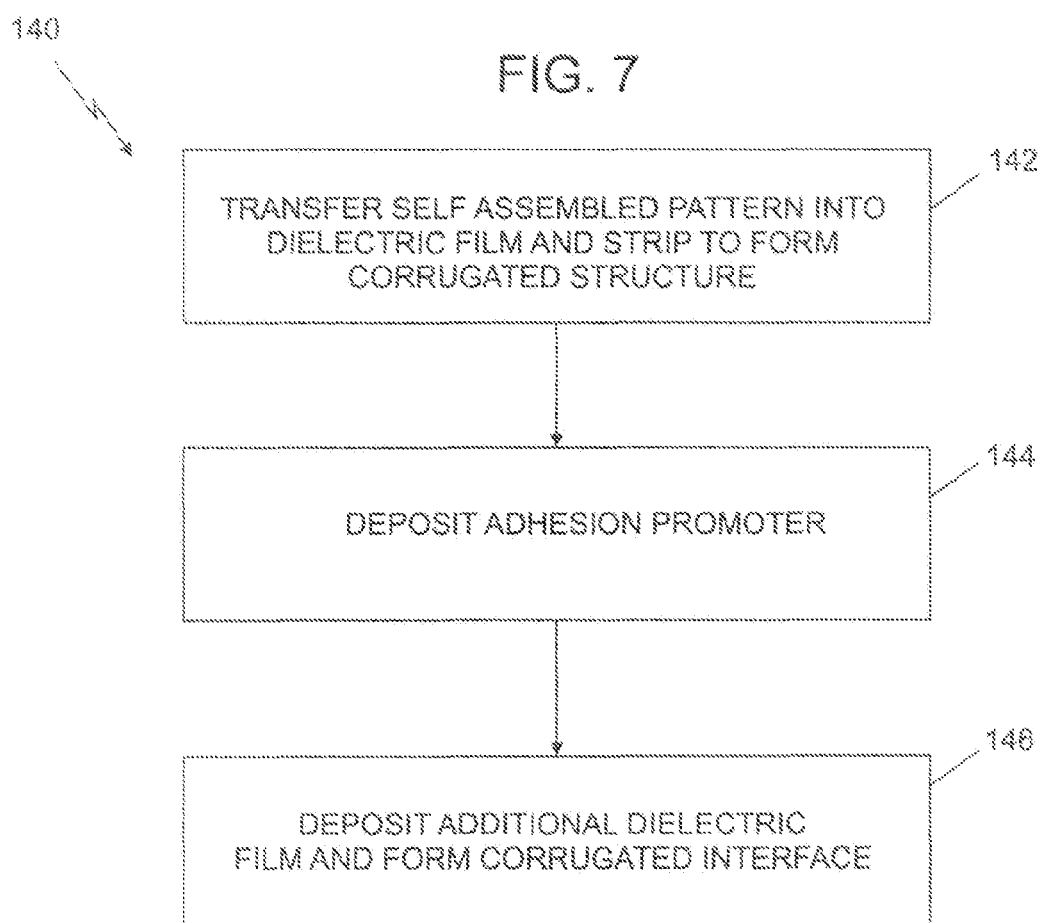
FIG. 7 illustrates a process flow for forming the nanoscale corrugated structure in accordance with still another embodiment.

In still another embodiment, the process flow 140 shown in FIG. 7 includes forming a nanoscale corrugated structure in the dielectric film layer as presented in step 142 followed by deposition of an adhesion promoter as in step 144. Formation of the nanoscale corrugated structure can be performed in the manner described in relation to the process flow described in FIG. 5. Step 144 includes applying a monolayer coating of an adhesion promoter such as an aminosilane onto the corrugated surface (e.g., as shown in FIG. 4). Such adhesion promoter layers are known to be very thin and conformal over many types of organic and inorganic dielectrics. For example, hexamethyldisilazine (HMDS) is a compound that is commonly used in semiconductor manufacturing processes. HMDS is typically used as a primer for increasing adhesion of a photoresist layer to the substrate. HMDS reacts to dehydrate any silanol groups present on the substrate surface resulting in a trimethyl silyl termination in their place and generates ammonia as a byproduct. In this manner, HMDS increases the hydrophobicity of the surface. An additional dielectric film is then applied onto the adhesion promoter and corrugated surface as shown in step 146 so as to form a corrugated interface with a conformal adhesion promoter disposed between the two dielectrics. It should be clear that the process flow described in FIG. 6 differs from the process flow of FIG. 7 in that the device that structure in FIG. 6 will not have corrugations in the first dielectric but rather a corrugated adhesion promoter layer. In contrast, FIG. 7 provides the first dielectric with a corrugated upper surface coated intimately with a monolayer thin adhesion promoter.

In the above noted embodiment, the corrugated self assembled adhesion promoter layer is used as is, is permanently retained in the interconnect stack, and no pattern transfer process into the first dielectric is required.

In the resulting structures and processes, the dielectric layers will be interlocked in a mechanical sense due to the corrugations provided. If the corrugations comprise a means of incorporating an adhesion promoter (a coating or as a self assembled layer), the corrugated surface will also be more wettable by the second dielectric. This can ensure that the interpenetration and interlocking of the second dielectric into the underlayer is enhanced. The intrinsic chemical adhesion between the two layers will also be enhanced by the adhesion promoter.

This process can be repeated as required to form a multilayer dielectric stack with a multiplicity of such nanoscale corrugated interfaces.

In the event an interfacial crack is initiated in the dielectric stack, its propagation will be significantly slow due to the zigzag nature of the interface that the crack must propagate through, which is due to the nanoscale corrugations. Thus, for a given interfacial fracture toughness in the case of a smooth interface between the two dielectrics, the corrugated interface morphology will exhibit higher apparent toughness as a larger interface area has to be created in propagating the crack along a corrugated interface as opposed to a smooth and planar interface.

In the event a non-interfacial (out-of-plane) crack is initiated in the dielectric stack, its propagation in the direction perpendicular to the orientation of the nanoscale corrugations will be significantly inhibited due to high density of interfacial pinning sites and material discontinuity in the direction of propagation. When such a crack intersects the nanocorrugated interface, crack branching at the crack tip can occur along the corrugation facets nominally parallel to the primary crack growth direction. This will result in lowered stress concentration at the crack tip.

Overall, for a given fracture toughness in the case of a smooth interface between the two dielectrics, the corrugated interface morphology will exhibit higher apparent toughness as a larger interface area has to be created in propagating the crack along a corrugated interface as opposed to a smooth and planar interface. Thus, the net effect would be one of increased fracture resistance in the structures with nano-corrugated interfaces as opposed to ones with smooth interfaces.

Although the above described inventive structures and process flows provide specific details, these are meant to be illustrative and not limiting in their scope. For example, the substrate described in the various structures can be selected from a variety of microelectronic substrates such as silicon or gallium arsenide with embedded device regions and interconnect wiring, multilayer ceramic substrates, printed wiring board substrates with embedded interconnect wiring and the like. Dielectric layers described in the inventive structures can be monolithic films as shown in the illustrative examples or may contain embedded interconnect wires as in back end of the line damascene interconnects known in the art. In this latter case, the nano-scale corrugations can be formed only on the dielectric surfaces or both the dielectric and metal interconnect surfaces as needed.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A microelectronic device, comprising:
a first dielectric layer having a corrugated top surface, wherein the corrugated top surface comprises a plurality of troughs and ridges having a substantially constant pitch, wherein the troughs and ridges each have widths less than or equal to 100 nanometers;
a second dielectric layer disposed on the first dielectric layer having a complementary corrugated surface; and
a self assembled adhesion promoter layer intermediate the first and second dielectric layers.

2. The device of claim 1, wherein the second dielectric comprises a corrugated top surface.

3. A device of claim 2, further comprising at least one additional dielectric layer disposed on the second dielectric layer.

4. The device of claim 1, wherein the first and second dielectric layers define an interconnect stack and the device comprises at least two interconnect stacks.

5. The device of claim 1, wherein the corrugations are at a height less than or equal to 10% of a thickness for the first or second dielectric layers 6. The device of claim 1, wherein the plurality of troughs and ridges each have widths of 2 to 20 nanometers.

* * * * *